(12) United States Patent
Hamamoto et al.

(10) Patent No.: US 9,117,985 B2
(45) Date of Patent: Aug. 25, 2015

(54) SILICONE RESIN COMPOSITION AND AN OPTICAL SEMICONDUCTOR DEVICE

(71) Applicant: SHIN-ETSU CHEMICAL CO., LTD., Tokyo (JP)

(72) Inventors: Yoshihira Hamamoto, Annaka (JP); Tsutomu Kashiwagi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/546,569

(22) Filed: Nov. 18, 2014

(65) Prior Publication Data

US 2015/0144987 A1    May 28, 2015

(51) Int. Cl.
*C08G 77/08* (2006.01)
*H01L 33/56* (2010.01)
*C08L 83/14* (2006.01)
*C08G 77/52* (2006.01)

(52) U.S. Cl.
CPC .................. *H01L 33/56* (2013.01); *C08L 83/14* (2013.01); *C08G 77/52* (2013.01)

(58) Field of Classification Search
CPC .......... C08G 77/52; C08L 83/14; H01L 23/28
USPC ....................................... 528/15, 31
See application file for complete search history.

(56) References Cited

U.S. PATENT DOCUMENTS

| | | | | |
|---|---|---|---|---|
| 3,350,350 A * | 10/1967 | Siegfried | ......................... | 528/14 |
| 3,398,175 A * | 8/1968 | Leitheiser | ..................... | 556/433 |
| 5,578,380 A * | 11/1996 | Babu | ............................. | 428/447 |
| 6,046,294 A * | 4/2000 | Achenbach et al. | ............ | 528/15 |
| 7,323,250 B2 * | 1/2008 | Tabei et al. | ..................... | 428/447 |
| 8,344,075 B2 * | 1/2013 | Kim et al. | ...................... | 525/477 |
| 8,877,877 B2 * | 11/2014 | Koh et al. | ...................... | 525/478 |
| 2011/0227235 A1 | 9/2011 | Yoshitake et al. | | |

FOREIGN PATENT DOCUMENTS

| | | |
|---|---|---|
| JP | A-2009-215434 | 9/2009 |
| JP | A-2010-084118 | 4/2010 |
| JP | A-2013-023545 | 2/2013 |
| JP | A-2013-107983 | 6/2013 |
| JP | A-2013-107985 | 6/2013 |

* cited by examiner

*Primary Examiner* — Margaret Moore

(74) *Attorney, Agent, or Firm* — Oliff PLC

(57) ABSTRACT

One purpose is to provide a silicone resin composition which provides a cured product having a large Abbe's number and a high brightness. A silicone resin composition including (A-1) an organopolysiloxane having a three-dimensional crosslinked structure, at least two alkenyl groups, and at least one monovalent aromatic hydrocarbon group bonded to a silicon atom, (A-2) a linear organopolysiloxane having alkenyl groups at at least both terminals of a molecular chain and at least one monovalent aromatic hydrocarbon group bonded to a silicon atom, (B-1) a linear organohydrogen polysiloxane having at least one silphenylene skeleton in a molecular chain and hydrosilyl groups at least both terminals of the molecular chain, in an amount such that a ratio of the number of the hydrosilyl groups in component (B-1) to a total number of the alkenyl groups in components (A-1) and (A-2) is 0.5 to 2, and (C) a hydrosilylation catalyst in a catalytic amount.

10 Claims, No Drawings

SILICONE RESIN COMPOSITION AND AN OPTICAL SEMICONDUCTOR DEVICE

CROSS REFERENCE

This application claims the benefits of Japanese Patent Application No. 2013-243216 filed on Nov. 25, 2013, the contents of which are herein incorporated by reference.

FIELD OF THE INVENTION

The present invention relates to a curable silicone resin composition which is useful as encapsulating materials for optical devices such as optical elements, and other electronic devices such as semiconductor elements.

In recent years, output powers of blue or white light-emitting diodes (LEDs) increased and the LEDs have been used for flashlight of cellular telephones, back light of liquid crystal screens and general purpose illuminations. Then, on account of the high-power LEDs, amounts of ultraviolet light and heat generated by LEDs increase, and, therefore, materials of devices need high light resistance, heat resistance and crack resistance.

Materials for covering or encapsulating LEDs need to have transparency. Japanese Patent Application Laid-Open No. 2013-023545, Patent Literature 1, describes that a conventional epoxy resin has high hardness and good crack resistance, but has problems such that the resin causes discoloration by ultraviolet light or heat to decrease output powers of LEDs.

Further, in recent years, high brightness LEDs which generate a high intensity of light and a large amount of heat have been commercialized and widely used for general purpose illuminations. Then, discoloration of an encapsulating material caused by a corrosive gas has been a problem. Japanese Patent Application Laid-Open No. 2009-215434, Patent Literature 2, discloses that a silicone resin having an aliphatic hydrocarbon substituent, such as a methyl silicone resin, prevents degradation of an organic resin package to extend a life of LEDs.

Although the afore-mentioned silicone resin has good light resistance, heat discoloration resistance and high impact resistance, it have a large linear expansion coefficient and high gas permeability and, therefore, have a problem in reliability as an encapsulating material, which problem is caused by a corrosive gas. Further, it is known that the high gas permeability of the silicone resin leads to erosion of a silver plated surface in a substrate of an optical semiconductor device such as an LED and, eventually, to decrease brightness. Therefore, there is a need to improve the silicone resin.

Recent LEDs need to have further high brightness besides good light resistance, heat resistance and impact resistance. LEDs used for general purpose illuminations have brightness which is represented by lm/W, lumen per watt. When the value of lumen per watt is larger, the light has a larger amount of radiant flux per unit area. The use of a phenyl silicone as an encapsulating material is considered and the encapsulating material needs to decrease dispersion of luminous flux in order to increase the brightness. Therefore, a resin needs to have a large Abbe's number which is an inverse number of a degree of light diffusion.

Japanese Patent Application Laid-Open No. 2010-084118, Patent Literature 3, describes a method to increase a content of a phenyl group in a silicone resin so as to increase a refractive index and an Abbe's number of the silicone resin. Patent Literature 3 describes that diphenyl siloxane units which are a source of difunctional siloxane units, D units, are used to introduce phenyl groups as a side chain of a polysiloxane. However, an amount of phenyl groups introduced is restricted in this method, so that it is needed that a phenyl methyl siloxane unit is introduced in addition to the diphenyl siloxane unit. In this method, a sufficient effect is not attained.

Japanese Patent Application Laid-Open No. 2013-107985, Patent Literature 4, describes a method to introduce phenyl groups in a main chain of the resin wherein silphenylene groups are introduced in an organopolysiloxane having a resin structure, i.e. three-dimensional crosslinked structure. However, when an amount of the silphenylene group is large, the organopolysiloxane is cloudy and an organopolysiloxane obtained causes discoloration or gelation. Therefore, the organopolysiloxane was suitable for a silicone resin composition for a reflector which does not need transparency, but was not suitable as an encapsulating material for LEDs which need transparency.

Japanese Patent Application Laid-Open No. 2013-107983, Patent Literature 5, describes a method for introducing a phenyl group in a silicone resin by the use of an organosilicon compound to which a hydrolysable silyl group is introduced via an alkylene group, or a difunctional siloxane unit, D unit, at the both terminals of a silphenylene group. However, the compound described in Patent Literature 5 has an alkylene structure and a siloxane structure as a spacer. Therefore, a ratio of a weight of a silphenylene group relative to a total weight of the molecular is low and, accordingly, the method is not enough to attain the purpose of increasing an amount of an aromatic ring.

Further, all of the aforesaid silicone resin compositions having a silphenylene group are cured by hydrolysis and condensation. Curing by condensation proceed slowly. Therefore, even if curing is conducted under heating in the presence of a catalyst, there is a problem such that their curability is poor in the depth.

PRIOR LITERATURES

Patent Literatures

[Patent Literature 1] Japanese Patent Application Laid-Open No. 2013-023545
[Patent Literature 2] Japanese Patent Application Laid-Open No. 2009-215434
[Patent Literature 3] Japanese Patent Application Laid-Open No. 2010-084118
[Patent Literature 4] Japanese Patent Application Laid-Open No. 2013-107985
[Patent Literature 5] Japanese Patent Application Laid-Open No. 2013-107983

DISCLOSURE OF THE INVENTION

Problems to be Solved by the Invention

One of the purposes of the present invention is to provide a silicone resin composition which provides a cured product having a large Abbe's number and a high brightness.

Means to Solve the Problems

To solve the aforesaid problems, the present inventors have made research and found that an addition curing-type silicone resin composition comprising an organohydrogenpolysiloxane having a silphenylene skeleton, —Si—$C_6H_4$—Si—, in a molecular chain provides a cured product having a large Abbe's number and a high brightness.

Thus, the present invention provides a silicone resin composition comprising (A-1) an organopolysiloxane having a three-dimensional crosslinked structure, i.e. resin structure, at least two alkenyl groups, and at least one monovalent aromatic hydrocarbon group bonded to a silicon atom, (A-2) a linear organopolysiloxane having alkenyl groups at at least both terminals of a molecular chain and at least one monovalent aromatic hydrocarbon group bonded to a silicon atom, (B-1) a linear organohydrogen polysiloxane having at least one silphenylene skeleton in a molecular chain and hydrosilyl groups at at least both terminals of the molecular chain, in an amount such that a ratio of the number of the hydrosilyl groups in component (B-1) to a total number of the alkenyl groups in components (A-1) and (A-2) is 0.5 to 2, and (C) a hydrosilylation catalyst in a catalytic amount. Further, the present invention provides an optical semiconductor device provided with a cured product obtained by curing the silicone resin composition.

Effects of the Invention

The present silicone resin composition provides a cured product having a larger Abbe's number. The silicone resin composition is used to encapsulate an optical semiconductor element, such as an LED, to provide an optical semiconductor device having a smaller light dispersion and a higher brightness. Further, on account of the silphenylene skeleton present in the cured product, the cured product is rigid and, therefore, has excellent heat resistance and impact resistance and has a lower gas permeability.

BEST MODE OF THE INVENTION (A-1) Organopolysiloxane Having a Three-Dimensional Crosslinked Structure Component (A-1) is an organopolysiloxane having a three-dimensional crosslinked structure which has at least two alkenyl groups and at least one monovalent aromatic hydrocarbon group bonded to a silicon atom. The organopolysiloxane may be represented by the following average compositional formula (2):

$$R^1_a R^2_b R^3_c SiO_{(4-a-b-c)/2} \quad (2)$$

wherein $R^1$ is, independently of each other, a substituted or unsubstituted monovalent aliphatic hydrocarbon group which has 1 to 10 carbon atoms, $R^2$ is, independently of each other, a monovalent aromatic hydrocarbon group having 6 to 12 carbon atoms, $R^3$ is, independently of each other, an alkenyl group having 2 to 8 carbon atoms, a is the number of 0.4 to 1, b is the number of 0.1 to 0.5, and c is the number of 0.05 to 0.5, provided that a total of a, b and c is 0.5 to 2.

In the formula (2), $R^1$ is a substituted or unsubstituted monovalent aliphatic hydrocarbon group which has 1 to 10, preferably 1 to 6 carbon atoms. Examples of $R^1$ include alkyl groups such as methyl, ethyl, propyl, isopropyl, butyl, isobutyl, tert-butyl, pentyl, neopentyl, hexyl, octyl, nonyl and decyl groups; and those groups where a part or the whole of their hydrogen atoms are replaced with a halogen atom(s), such as fluorine, bromine and chlorine atoms, or a cyano group, such as halogen-substituted alkyl groups, for instance, chloromethyl, chloropropyl, bromoethyl and trifluoropropyl groups, and a cyanoethyl group.

In the formula (2), $R^2$ is, independently of each other, a monovalent aromatic hydrocarbon group having 6 to 12, preferably 6 to 10 carbon atoms, such as aryl groups and aralkyl groups. Examples of the aryl groups include phenyl, tolyl, xylyl, and naphthyl groups. Examples of the aralkyl groups include benzyl, phenylethyl and phenylpropyl groups. Among these, a phenyl group, a tolyl group, a benzyl group and a phenylethyl group are preferable. In particular, a phenyl group is preferred. In the organopolysiloxane, the number of the monovalent aromatic hydrocarbon group is preferably 5 to 65%, more preferably 15 to 65%, relative to a total number of the substituents each bonded to a silicone atom. If the number is smaller than the aforesaid lower limit, gas permeability tends to be too large. If the number is larger than the aforesaid upper limit, the siloxane has too many aromatic hydrocarbon groups and its structure tends to be rigid, so that a resin obtained tends to be fragile.

In the formula (2), $R^3$ is, independently of each other, an alkenyl group having 2 to 8, preferably 2 to 6, carbon atoms. Examples of $R^3$ include vinyl, allyl, propenyl, isopropenyl, butenyl, hexenyl, cyclohexenyl and octenyl groups. Among these, vinyl and allyl groups are preferred. The number of $R^3$ is preferably 5 to 50%, more preferably 10 to 30%, relative to a total number of the substituents each bonded to a silicone atom. When the number is the aforesaid lower limit or more, strength of a cured product does not decrease too much though the cured product is soft. When the number is the aforesaid upper limit or less, a cured product is not fragile though the cured product is hard.

The organopolysiloxane (A-1) preferably comprises $R^4 SiO_{3/2}$ unit, $R^3_k R^4_p SiO_{2/2}$ unit and $R^3_q R^4_r SiO_{1/2}$ unit, wherein $R^3$ is as defined above, $R^4$ is selected from the aforementioned groups defined for $R^1$ and $R^2$, preferably $R^4$ is a methyl group or a phenyl group, k is an integer of 0 or 1, and p is an integer of 1 or 2, provided that k+p=2, q is an integer of from 1 to 3, and r is an integer of from 0 to 2, provided that q+r=3.

Here the $R^4 SiO_{3/2}$ unit is abbreviated as "a'"; the $R^3_k R^4_p SiO_{2/2}$ unit, as "b'"; and the $R^3_q R^4_r SiO_{1/2}$ unit, as "c'". A molar ratio, (b'+c')/a', is preferably 0.01 to 1, more preferably 0.1 to 0.5; a molar ratio, c'/a', is preferably 0.01 to 1, more preferably 0.1 to 0.5; and b'/a' is preferably 0 to 0.99, more preferably 0 to 0.4. A weight average molecular weight of the organopolysiloxane, as determined by gel permeation chromatography (GPC), reduced to polystyrene, is preferably in the range of 500 to 10,000, more preferably 1,000 to 8,000.

In the present invention, the weight average molecular weight is as determined by GPC, reduced to polystyrene, in the following conditions throughout this specification.
Developing solvent: THF
Flow rate: 0.6 mL/min
Detector: Differential refractive index detector (RI)
Column: TSK Guardcolomn SuperH-L
TSKgel SuperH4000 (6.0 mmI.D.×15 cm×1)
TSKgel SuperH3000 (6.0 mmI.D.×15 cm×1)
TSKgel SuperH2000 (6.0 mmI.D.×15 cm×2)
  (all produced by TOSO Co. Ltd.)
Column temperature: 40 degrees C.
Injection volume: 20 μL (0.5 weight % solution in THF)

The organopolysiloxane may further comprise small amounts of bifunctional siloxane units and trifunctional siloxane units in addition to the aforesaid $R^4 SiO_{3/2}$ unit, $R^3_k R^4_p SiO_{2/2}$ unit and $R^3_q R^4_r SiO_{1/2}$ unit, as long as the purposes of the present invention are not obstructed.

The organopolysiloxane can be easily prepared by combining source compounds for $R^4 SiO_{3/2}$, $R^3_k R^4_p SiO_{2/2}$ and $R^3_q R^4_r SiO_{1/2}$ units so that the afore-mentioned molar ratios are met and, for instance, subjecting them to co-hydrolysis in the presence of an acid. The co-hydrolysis may be carried out in conventional manners.

As the source compound for $R^4SiO_{3/2}$ units, use may be made of phenyltrichlorosilane, phenyltrimethoxysilane, phenyltriethoxysilane, cyclohexyltrichlorosilane, cyclohexyltrimethoxysilane, cyclohexyltriethoxysilane, cyclopentyltrichlorosilane, n-propyltrichlorosilane, methyltrichlorosilane, methyltrimethoxysilane, and methyltriethoxysilane.

As the source compound for $R^3_k R^4_p SiO_{2/2}$, use may be made of methoxysilanes such as dimethyldimethoxysilane, diphenyldimethoxysilane, phenylmethyldimethoxysilane, cyclohexylmethyldimethoxysilane, dicyclohexyldimethoxysilane, cyclopentylmethyldimethoxysilane, and dicyclopentyldimethoxysilane; ethoxysilanes such as dimethyldiethoxysilane, phenylmethyldiethoxysilane, cyclohexylmethyldiethoxysilane, dicyclohexyldiethoxysilane, cyclopentylmethyldiethoxysilane, and dicyclopentyldiethoxysilane; and chlorosilanes such as dimethyldichlorosilane, diphenyldichlorosilane, phenylmeythyldichlorosilane, cyclohexylmethyldichlorosilane, dicyclohexyldichlorosilane, cyclopentylmethyldichlorosilane and dicyclopentyldichlorosilane.

As the source compound for $R^3_q R^4_r SiO_{1/2}$ unit, the following compounds may be used:

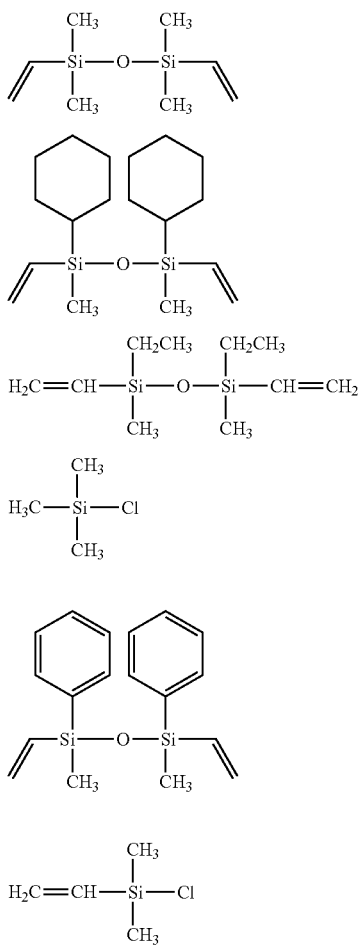

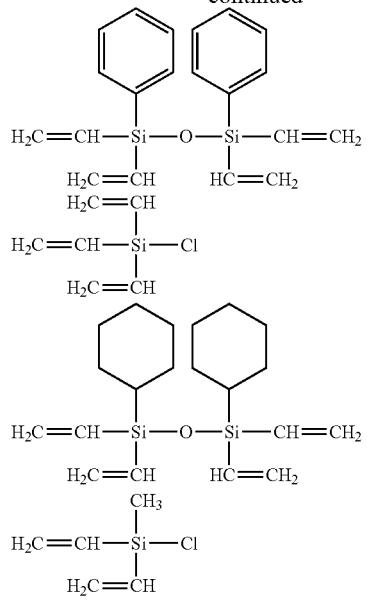

(A-2) Linear Organopolysiloxane

Component (A-2) is a linear organopolysiloxane having alkenyl groups each bonded to a silicon atom at at least both terminals of a molecular chain and at least one monovalent aromatic hydrocarbon group bonded to a silicon atom. One of characteristics of the present invention is in that component (A-1) is contained in the composition in combination with component (A-2).

Component (A-2) preferably has a linear structure whose main chain is composed of repeating diorganosiloxane units represented by $R^{42}SiO_{2/2}$ and in which the both terminals are blocked with triorganosiloxy groups represented by $R^3_g R^4_{3-g} SiO_{1/2}$. In the formulas, $R^3$ is an alkenyl group having 2 to 8 carbon atoms and as defined for $R^3$ above. $R^4$ is a substituted or unsubstituted, saturated monovalent aliphatic hydrocarbon group having 1 to 10 carbon atoms, or a monovalent aromatic hydrocarbon group having 6 to 12 carbon atoms, and is selected from the aforementioned groups defined for $R^1$ and $R^2$. g is an integer of from 1 to 3, and preferably g is 1.

In the linear organopolysiloxane, the number of the monovalent aromatic hydrocarbon group bonded to a silicon atom is 5 to 45%, preferably 10 to 45%, more preferably 20 to 40%, relative to a total number of the substituents each bonded to a silicone atom. If the number is smaller than the aforesaid lower limit, gas permeability tends to be too high. If the number is larger than the aforesaid upper limit, the siloxane has too many aromatic hydrocarbon groups directly bonded to a silicon atom which can move freely and, therefore, distortion may occur in molecular arrangement. Therefore, change of a refractive index with varying a wavelength is too large and an Abbe's number tends to be smaller. This is not preferable.

The monovalent aromatic hydrocarbon group has 6 to 12, preferably 6 to 10 carbon atoms. Examples of the monovalent aromatic hydrocarbon group include aryl groups such as phenyl, tolyl, xylyl, and naphthyl groups; and aralkyl groups such as benzyl, phenylethyl and phenylpropyl groups. Among these, a phenyl group, a tolyl group, a benzyl group and a phenylethyl group are preferable, and in particular a phenyl group is preferred.

The linear organopolysiloxane has a viscosity of 10 to 1,000,000 mPa·s, preferably 100 to 50,000 mPa·s, in view of the workability and curability. The viscosity is determined at 25 degrees C. with a Brookfield rotational viscometer according to the Japanese Industrial Standards (JIS) K 7117-1.

Examples of the linear organopolysiloxane include the following compounds:

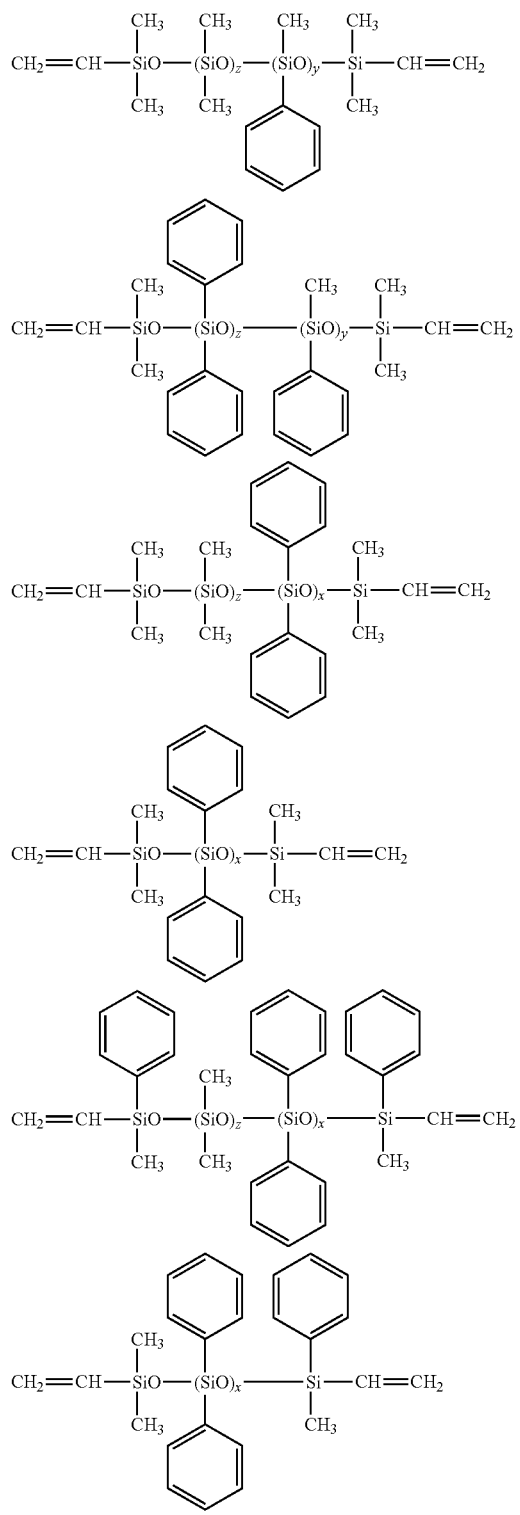

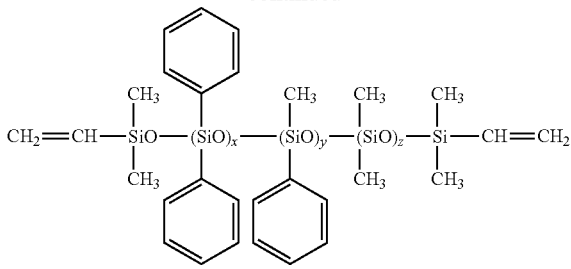

wherein, x, y and z are zero or a positive integer which satisfy the equation $3 \leq (x+y+z) \leq 1{,}000$ and are such that the linear organopolysiloxane has the aforesaid viscosity.

The organopolysiloxane having a resin structure (A-1) is used to improve physical strength and tackiness of a surface of a cured product. The linear organopolysiloxane (A-2) is used to provide flexibility to a cured product. The amount of component (A-1) is preferably 20 to 95 mass %, more preferably 40 to 90 mass %, relative to a total mass of components (A-1) and (A-2). When the amount of the organopolysiloxane (A-1) is within the aforesaid lower limit or more, the aforementioned effects are attained sufficiently. When the amount of the organopolysiloxane resin (A-1) is within the aforesaid upper limit or less, the viscosity of the composition does not increase excessively and no or less cracks occur in a cured product.

(B-1) Organohydrogen Polysiloxane Having a Silphenylene Structure

Component (B-1) is a linear organohydrogen polysiloxane which has at least one silphenylene skeleton, i.e. —Si—$C_6H_4$—Si—, in a molecular chain and hydrosilyl groups at at least both terminals of the molecular chain. This component (B-1) and the organohydrogen polysiloxane (B-2) with no silphenylene skeleton cause a hydrosilylation reaction with the alkenyl group-containing organopolysiloxanes, components (A-1) and (A-2), hereinafter collectively referred to as component (A), to form a cured product. Component (B-1) in the present silicone resin composition yields an increased Abbe's number of a cured product and decreased gas permeability of a cured product.

Component (B-1) is preferably an organohydrogen polysiloxane represented by the following general formula (1):

(1)

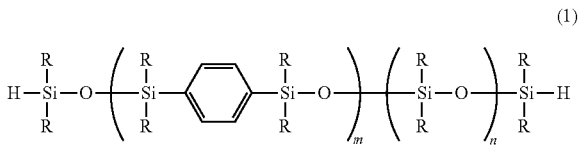

wherein R is, independently of each other, selected from the group consisting of substituted or unsubstituted, monovalent aliphatic hydrocarbon groups which have 1 to 10 carbon atoms and may have an unsaturated bond, and monovalent aromatic hydrocarbon groups having 6 to 12 carbon atoms, m is an integer of from 1 to 1,000, n is an integer of from 0 to 300, and the parenthesized repeating units may bond randomly each other or form a block unit.

In the formula (1), R is, independently of each other, selected from the group consisting of substituted or unsubstituted, monovalent aliphatic hydrocarbon groups which have 1 to 10, preferably 1 to 6 carbon atoms and may have an unsaturated bond, and monovalent aromatic hydrocarbon groups having 6 to 12, preferably 6 to 10 carbon atoms. Examples of the monovalent aliphatic hydrocarbon group include alkyl groups such as methyl, ethyl, propyl, isopropyl, butyl, isobutyl, tert-butyl, pentyl, neopentyl, hexyl, octyl, nonyl and decyl groups; an alkenyl group such as vinyl, allyl, propenyl, isopropenyl, butenyl, hexenyl, cyclohexenyl and octenyl groups; and those groups where a part or the whole of their hydrogen atoms are replaced with a halogen atom(s), such as fluorine, bromine and chlorine atoms, or a cyano group, such as halogen-substituted alkyl groups, for instance, chloromethyl, chloropropyl, bromoethyl and trifluoropropyl groups, and a cyanoethyl group. Examples of the monovalent aromatic hydrocarbon groups include aryl or aralkyl groups. Examples of the aryl groups include phenyl, tolyl, xylyl, and naphthyl groups. Examples of the aralkyl groups include benzyl, phenylethyl and phenylpropyl groups. Among these, a phenyl group, a tolyl group, a benzyl group and a phenylethyl group are preferable, and in particular a phenyl group is preferred.

In component (B-1), the number of the monovalent aromatic hydrocarbon group bonded to a silicon atom is 0 to 50%, preferably 5 to 40%, relative to a total number of the substituents each bonded to a silicone atom. If the number is larger than the aforesaid upper limit, the siloxane has too many aromatic hydrocarbon groups and its structure tends to be rigid, so that a resin obtained tends to be fragile.

In the formula (1), m is an integer of from 1 to 1,000 and n is an integer of from 0 to 300, preferably m is an integer of from 1 to 500 and n is an integer of from 0 to 200, and more preferably m is an integer of from 1 to 100 and n is an integer of from 0 to 100. n may be zero. When m and n is within the aforesaid limits, a cured product has lower gas permeability and a larger Abbe's number. When n is larger than the upper limit, an amount of the diorganosiloxane relative to an amount of silphenylene moiety is too large, and a cured product having high brightness may not be obtained.

Preferably, component (B-1) is the following compounds:

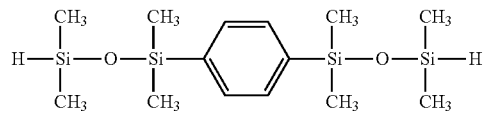

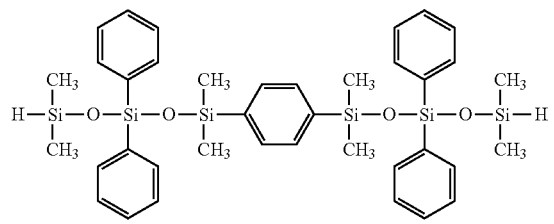

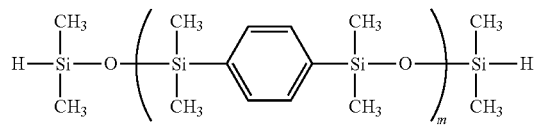

wherein m is an integer of from 1 to 100

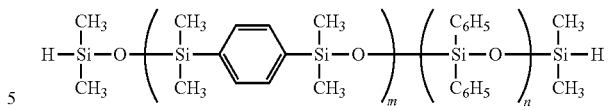

wherein m is an integer of from 1 to 100, n is an integer of from 0 to 100, and the parenthesized repeating units may bond randomly each other or form a block unit.

Component (B-1) may be prepared, for instance, by condensation of an alkoxysilane and a hydrosilane in the presence of a catalyst. The catalyst may be tris(pentafluorophenyl)borane and platinum group metal catalysts. The amount of the catalyst may be an effective amount to promote the condensation and is not limited to any particular one. For instance, the amount of the catalyst is 0.0001 to 1.0 part by mass, relative to 100 parts by mass of the silicone. The reaction time and temperature are not limited to any particular ones. For instance, the reaction may be carried out at 20 to 100 degrees C. for 1 to 10 hours. Compound (B-1) may also be prepared by a cohydrolysis of a hydrolyzable silane having a silphenylene unit and a hydrolyzable silane which is a source compound for a dialkylsiloxane.

(B-2) Organohydrogen Polysiloxane Having No Silphenylene Structure

Component (B-2) has at least two hydrosilyl groups and no silphenylene skeleton in a molecular. Component (B-2) and the aforesaid component (B-1) are subjected to a hydrosilylation with component (A) to form a cured product. On account of component (B-2), heat resistance and light resistance of a silicone resin are improved.

Component (B-2) is preferably represented by the following general formula (3):

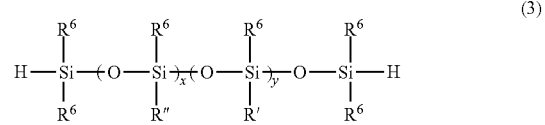

wherein $R^6$ is, independently of each other, selected from the group consisting of substituted or unsubstituted, monovalent aliphatic hydrocarbon groups which has 1 to 10 carbon atoms and may have an unsaturated bond, and monovalent aromatic hydrocarbon groups having 6 to 12 carbon atoms, R' is, independently of each other, selected from the aforementioned groups defined for $R^6$ or a group represented by the following (4):

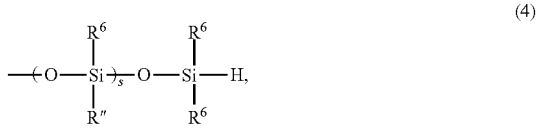

wherein R" is a hydrogen atom or is selected from the aforementioned groups defined for $R^6$, the parenthesized repeating units may bond randomly each other or form a block unit, x is an integer of from 0 to 1,000, y is an integer of from 0 to 1,000, and s is an integer of from 0 to 1,000, provided that a total of x, y and s is 1 to 1,000.

In the formula (3), $R^6$ is, independently of each other, selected from the group consisting of substituted or unsubstituted, monovalent aliphatic hydrocarbon groups which have 1 to 10, preferably 1 to 6 carbon atoms and may have an unsaturated bond, and monovalent aromatic hydrocarbon groups having 6 to 12, preferably 6 to 10 carbon atoms. Examples of the monovalent aliphatic hydrocarbon group include alkyl groups such as methyl, ethyl, propyl, isopropyl, butyl, isobutyl, tert-butyl, pentyl, neopentyl, hexyl, octyl, nonyl and decyl groups; an alkenyl group such as vinyl, allyl, propenyl, isopropenyl, butenyl, hexenyl, cyclohexenyl and octenyl groups; and those groups where a part or the whole of their hydrogen atoms are replaced with a halogen atom(s), such as fluorine, bromine and chlorine atoms, or a cyano group, such as halogen-substituted alkyl groups, for instance, chloromethyl, chloropropyl, bromoethyl and trifluoropropyl groups, and a cyanoethyl group. Examples of the monovalent aromatic hydrocarbon groups include aryl or aralkyl groups. Examples of the aryl groups include phenyl, tolyl, xylyl, and naphthyl groups. Examples of the aralkyl groups include benzyl, phenylethyl and phenylpropyl groups. Among these, a phenyl group, a tolyl group, a benzyl group and a phenylethyl group are preferable, and in particular a phenyl group is preferred.

x is an integer of from 0 to 1,000, preferably 1 to 100. y is an integer of from 0 to 1,000, preferably 1 to 50. s is an integer of from 0 to 1,000, preferably 1 to 50. The total amount of x, y and s is 1 to 1,000, preferably 1 to 300, further preferably 3 to 200.

In component (B-2), the number of the monovalent aromatic hydrocarbon group bonded to a silicon atom is 5 to 50%, preferably 10 to 40%, relative to a total number of the substituents each bonded to a silicone atom. If the number is larger than the aforesaid upper limit, the siloxane has too many aromatic hydrocarbon group and its structure tends to be rigid, so that a resin obtained tends to be fragile.

Examples of the linear organohydrogen polysiloxane represented by the formula (3) include a compound represented by the following formula:

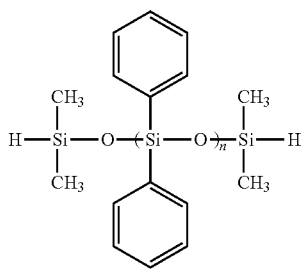

wherein n is an integer of 1 to 3.

Examples of the branched organohydrogen polysiloxane represented by the formula (3) include compounds represented by the following formulas.

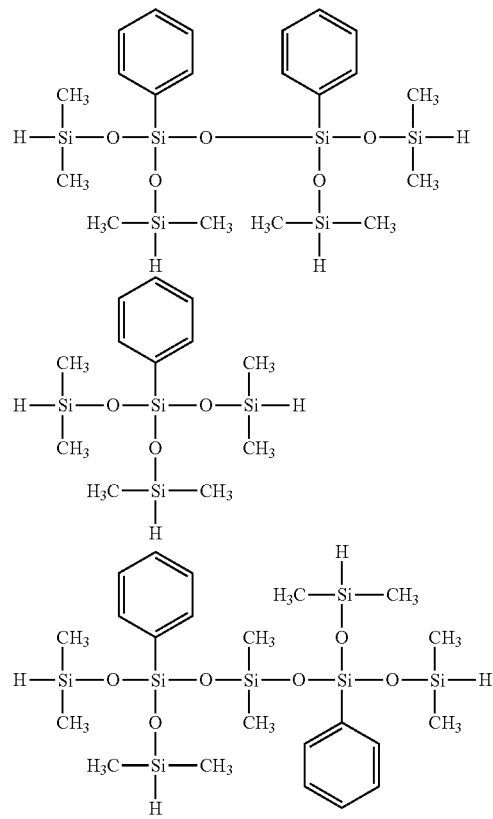

The amount of the aforesaid component (B-1) is preferable 10 to 90 mass %, more preferable 30 to 80 mass %, based on a total amount of components (B-1) and (B-2). If the amount of component (B-1) is too small, the effect by the silphenylene structure may not be attained sufficiently. If the amount of component (B-1) is too large, gas permeability may be higher or heat resistance may be lower in a cured product, so that reliability of LED devices tends to be worse.

In the present resin composition, an amount of the organohydrogen polysiloxane, that is, a total amount of components (B-1) and (B-2), hereinafter collectively referred to as component (B), is an effective amount to cure component (A). In particular, the amount of component (B) is such that a ratio of the number of the hydrosilyl groups in component (B) to a total number of the alkenyl groups, such as a vinyl group, in component (A) is 0.5 to 2, particularly preferably 0.9 to 1.5, further preferably 0.9 to 1.3. If the amount of component (B) is smaller than the aforesaid lower limit, the curing reaction does not proceed and it is difficult to obtain a cured product. If the amount of component (B) is larger than the aforesaid upper limit, a large amount of unreacted SiH groups remain in a cured product, so that rubber properties may change over time.

(C) Hydrosilylation Catalyst

The catalyst is to accelerate the addition reaction of components (A) and (B). The catalyst may be a compound of a platinum group metal such as platinum, palladium or rhodium. Catalyst comprising platinum is preferred in costs. Examples of the catalyst include $H_2PtCl_6 \cdot mH_2O$, $K_2PtCl_6$, $KHPtCl_6 \cdot mH_2O$, $K_2PtCl_4$, $K_2PtCl_4 \cdot mH_2O$, and $PtO_2 \cdot mH_2O$, wherein m is a positive integer. Complexes of the platinum group metal catalyst with a hydrocarbon such as an olefin, an alcohol or a vinyl group-containing organopolysiloxane may also be used. The afore-mentioned catalysts may be used singly or in combination of two or more of them.

The catalysts may be used in a catalytic amount to accelerate the addition reaction of components (A) and (B). In particular the amount is preferably 0.0001 to 0.2 part by mass, more preferably 0.0001 to 0.05 part by mass, reduced as a platinum group metal, relative to the total 100 parts by mass of components (A) and (B).

(D) Adhesion-Imparting Agent

The present silicone resin composition may further comprise an adhesion-imparting agent in addition to components (A), (B) and (C). Examples of the adhesion-imparting agent include vinyltrimethoxysilane, vinyltriethoxysilane, 2-(3,4-epoxycyclohexyl)ethyltrimethoxysilane, 3-glysidoxypropyltrimethoxysilane, 3-glysidoxypropylmethyldiethoxysilane, 3-glysidoxypropyltriethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxylsilane, 3-aminopropyltriethoxylsilane, N-phenyl-3-aminopropyltrimethoxylsilane, 3-mercaptopropyltrimethoxylsilane, trimethoxysilane, and tetramethoxysilane, and products of co-hydrolysis of one or more of these silanes. The afore-mentioned adhesion-imparting agent may be used singly or in combination of two or more thereof. The amount of the adhesion-imparting agent is within 10 parts by mass or less, particularly ranges from 0.001 to 10 parts by mass, further particularly 0.01 to 5 parts by mass, relative to a total 100 parts by mass of components (A), (B) and (C). In particular, an adhesion-imparting agent represented by the following formula is preferable.

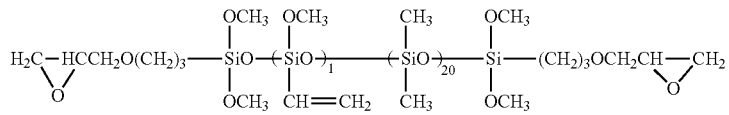

(E) Antioxidant

The present silicone resin composition may further comprise an antioxidant to improve heat resistance. Any conventional antioxidants may be used. In particular, hindered phenol antioxidants are preferred because an influence to the hydrosilylation is small. An amount of the antioxidant ranges from 0.001 to 5 parts by mass, preferably 0.1 to 3 parts by mass, relative to a total 100 parts by mass of components (A) and (B). If the amount is larger than the afore-mentioned upper limit, the remaining antioxidant bleeds out on the surface of the cured product. If the amount is less than the afore-mentioned lower limit, discoloration resistance of the cured product is poor.

Examples of the antioxidant include pentaerythritol tetrakis[3-(3,5-di-tert-butyl-4-hydroxyphenyl)propionate], N,N'-propane-1,3-diylbis[3-(3,5-di-tert-butyl-4-hydroxyphenyl)propionamide], thiodiethylenebis[3-(3,5-di-tert-butyl-4-hydroxyphenyl)propionate], octadecyl-3-(3,5-di-tert-butyl-4-hydroxyphenyl)propionate, 6,6'-di-tert-butyl-2,2'-thiodi-p-cresol, N,N'-hexane-1,6-diylbis[3-(3,5-di-tert-butyl-4-hydroxyphenylpropionamide)], benzenepropanoic acid, 3,5-bis(1,1-dimethylethyl)-4-hydroxy, alkyl ester having C7-C9 side chain, diethyl[[3,5-bis(1,1-dimethylethyl)-4-hydroxyphenyl]methyl]phosphonate, 2,2'-ethylenebis[4,6-di-tert-butylphenol], 3,3',3'',5,5',5''-hexa-tert-butyl-a,a',a''-(mesitylene-2,4,6-triyl)tri-p-cresol, calciumdiethylbis[[[3,5-bis(1,1-dimethylethyl)-4-hydroxyphenyl]methyl]phosphonate], 4,6-bis(octylthiomethyl)-o-cresol, 4,6-bis(dodecyithiomethyl)-o-cresol, ethylenebis(oxyethylene)bis[3-(5-tert-butyl-4-hydroxy-m-tolyl) propionate], hexamethylene-bis[3-(3,5-di-tert-butyl-4-hydroxyphenyl)propionate], 1,3,5-tris(3,5-di-tert-butyl-4-hydroxybenzyl)-1,3,5-triazine-2,4,6-trione, 1,3,5-tris[(4-tert-butyl-3-hydroxy-2,6-xylyl)methyl]-1,3,5-triazine-2,4,6-(1H,3H,5H)-trione, 6,6'-di-tert-butyl-4,4'-tiodi-m-cresol, 2,6-di-tert-butyl-4-(4,6-bis(octylthio)-1,3,5-triazin-2-ylamino)phenol, 3,4-dihydro-2,5,7,8-tetramethyl-2-(4,8,12-trimethyltridecyl)-2H-1-benzopyran-6-ol, 2',3-bis[[3-[3,5-di-tert-butyl-4-hydroxyphenyl]propionyl]] propionohydrazide, didodecyl 3,3'-thiodipropionate and dioctadecyl 3,3'-thiodipropionate. Examples of commercial products among them include Irganox 245, 259, 565, 1010, 1035, 1076, 1098, 1135, 1130, 1425WL, 1520L, 1726, 3114 and 5057, ex BASF Japan Ltd. These antioxidants may be used singly or in combination of two or more thereof.

The present silicone resin composition may further comprise conventional additives, if necessary, in addition to components (A) to (E). Examples of the additives include reinforcing inorganic fillers such as fumed silica and fumed titanium dioxide; non-reinforcing inorganic fillers such as calcium carbonate, calcium silicate, titanium dioxide, iron (III) oxide, carbon black and zinc oxide; light degradation-preventive agents such as hindered amine; and reactive diluents such as vinylethers, vinyl amides, epoxy resins, oxetanes, allyl phthalates and vinyl adipate. These additives may properly be added as long as the purposes of the present invention are not obstructed.

Method for Preparing the Silicone Resin Composition

The present silicone resin composition may be prepared by stirring, melting, mixing and dispersing the aforesaid components altogether or sequentially, if necessary, under heating. Typically, components (A) and (C), and component (B) are stored separately to avoid premature curing, and mixed at the time of use to cause curing. If component (B) and component (C) are stored together in one vessel, dehydrogenation may occur. Therefore, it is preferred to store component (B) and component (C) separately. Alternatively, a small amount of a cure inhibitor such as acetylenealcohol may be added to a mixture of components (A), (B) and (C) and stored.

Any stirring apparatus can be used, such as grinding machines equipped with a stirrer and a heater, a three-roll mill, a ball mill, and a planetary mixer. These apparatuses may be used in combination, if necessary. The viscosity of the present silicone resin composition determined at 25 degrees C. with a rotational viscometer according to JIS K 7117-1 is preferably 100 to 10,000,000 mPa·s, more preferably 300 to 500,000 mPa·s.

The silicone resin composition cures promptly, if necessary, under heating, to provide a cured product which has lower dispersion of luminous flux, high brightness and high transparency and adheres very strongly to package materials such as LCPs and to metal substrates. Therefore, the present silicone resin composition is suitable to encapsulate optical semiconductor elements. Examples of the optical semiconductor elements include LEDs, photodiodes, CCDs, CMOSes and photo couplers. In particular, the present silicone resin composition is suitable to encapsulate LEDs.

A method for encapsulating an optical semiconductor element with the present silicone resin composition may be chosen from any conventional methods, depending upon specific optical semiconductor element. Curing may usually be carried out at a temperature of 40 to 250 degrees C., preferably 60 to 200 degrees C., for 5 minutes to 10 hours, preferably 30 minutes to 6 hours, but are not limited to these.

The present cured product has a lower dispersion of luminous flux and a larger value of Abbe's number and, therefore, provides an optical semiconductor device having high brightness. The Abbe's number calculated from refractive index determined according to JIS K 7142 is 40 or larger, preferably 40 to 90, more preferably 50 to 90. If the Abbe's number is less than 40, a dispersion of luminous flux increases, so that brightness of an optical semiconductor device, such as an LED device, decreases. If the Abbe's number is larger than 90, a refractive index is too low, so that brightness decreases.

When a silver plated lead frame is encapsulated with the cured product obtained from the present silicone resin composition, it is preferred that a silver plated lead frame is surface treated in advance to increase the wettability with the silicone resin composition. The surface treatment is done preferably in a dry method, such as ultraviolet treatment, ozone treatment and plasma treatment, for workability and maintenance of the equipment. The plasma treatment is particularly preferred. A material of a pre-molded package preferably contains a silicone component of 15 mass % or more, based on total mass of the organic components, to increase compatibility with the silicone resin composition. Here, "silicone component" means a chemical compound having an SiO unit or a polymer thereof. If the amount of the silicone component is less than 15% by mass, the compatibility with the silicone resin composition is low, so that interstices (or voids) remain between the silicone resin composition and an inner wall of the pre-molded package in encapsulation operations, so that an optical semiconductor device obtained tends to cause cracks.

EXAMPLES

The present invention will be explained below in further detail with reference to a series of the Examples and the Comparative Examples, though the present invention is in no way limited by these Examples. In the following descriptions, an amount of a phenyl group is a percentage of the number of a phenyl group bonded to a silicone atom, relative to a total number of substituents each bonded to a silicone atom.

Synthesis Example 1

(A-1) Synthesis of Organopolysiloxane Resin 1

In a flask, put were 1050 g of xylene and 5143 g of water, to which a mixture of 2285 g (10.8 mols) of phenyltrimethoxysilane, 326 g (2.70 mols) of vinyl dimethyl chlorosilane and 1478 g of xylene was dropwise added and, then, stirred for 3 hours. The acid was separated, and the remaining mixture was washed with water. The remaining mixture was subjected to azeotropic distillation to remove water. Then, 6 g (0.15 mol) of KOH was added to the remaining mixture and heated at 150 degrees C. to reflux over a night. Then, the reaction mixture was neutralized with 27 g (0.25 mol) of trimethylchlorosilane and 24.5 g (0.25 mol) of potassium acetate, filtered and, subsequently, subjected to a distillation under reduced pressure to remove the solvent to obtain a siloxane resin represented by the following formula, hereinafter referred to as "organopolysiloxane resin 1". The vinyl equivalent was 0.197 mol/100 g. The amount of a phenyl group was 43.7%.

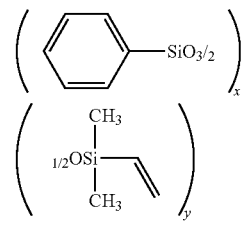

wherein x:y=7:3.

Synthesis Example 2

(A-1) Synthesis of Organopolysiloxane Resin 2

In a flask, put were 1000 g of xylene and 5014 g of water, to which a mixture of 2222 g (10.5 mols) of phenyltrimethoxysilane, 543 g (4.50 mols) of vinyl dimethyl chlorosilane and 1575 g of xylene was dropwise added and, then, stirred for 3 hours. The acid was separated, and the remaining mixture was washed with water. The remaining mixture was subjected to azeotropic distillation to remove water. Then, 6 g (0.15 mol) of KOH was added to the remaining mixture and heated at 150 degrees C. to reflux over a night. Then, the reaction mixture was neutralized with 27 g (0.25 mol) of trimethylchlorosilane and 24.5 g (0.25 mol) of potassium acetate, filtered and, subsequently, subjected to a distillation under reduced pressure to remove the solvent to obtain a siloxane resin represented by the following formula, hereinafter referred to as "organopolysiloxane resin 2". The vinyl equivalent was 0.141 mol/100 g. The amount of the phenyl group was 57%.

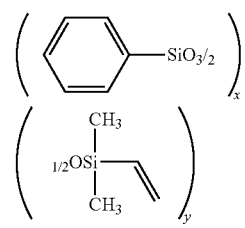

(x:y = 8:2)

Synthesis Example 3

(B-1) Synthesis of Organohydrogen Polysiloxane 1 Having a Silphenylene Skeleton

In a flask, put were 1.0 mole of 1,4-bis(dimethylmethoxysilyl)benzene and 201.48 g (1.50 mols) of 1,1,3,3-tetramethyldisiloxane, and was cooled. To the mixture, dropwise added was 18.24 g of strong sulfuric acid and subsequently dropwise added was 39.6 g of water, and stirred at 25 degrees C. over a night. The formed acid was separated, and the remaining mixture was washed with water, subjected to a distillation under reduced pressure to remove the solvent to obtain a siloxane resin represented by the following formula, hereinafter referred to as "silphenylene-containing hydrogen siloxane 1". The amount of the hydrogen gas was 125.97 ml/g.

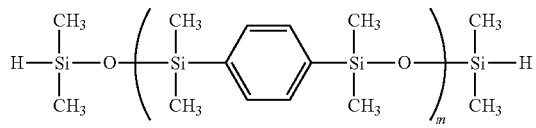

wherein average of m is 1.

Synthesis Example 4

(B-1) Synthesis of Organohydrogen Polysiloxane 2 Having a Silphenylene Skeleton

In a flask, put were 763.41 g (3.0 mols) of 1,4-bis(dimethylmethoxysilyl)benzene and 583.26 g (3.0 mols) of 1,4-bis(dimethylsilyl)benzene, and was cooled. To the mixture, dropwise added was 0.31 g (0.1 mol) of bis(pentafluorophenyl) borane and, then, stirred at 0 degrees C for 5 hours. Subsequently, the resulting mixture was washed with water and subjected to a distillation under reduced pressure to remove the solvent. To the remaining mixture, added was 26.86 g (0.20 mol) of 1,1,3,3-tetramethyldisiloxane, was cooled, subsequently dropwise added was strong sulfuric acid, and stirred at 25 degrees C. over a night. The resulting mixture was washed with water and subjected to a distillation under reduced pressure to remove the solvent to obtain a siloxane resin represented by the following formula, hereinafter referred to as "silphenylene containing-hydrogen siloxane 2". The amount of the hydrogen gas was 3.51 ml/g.

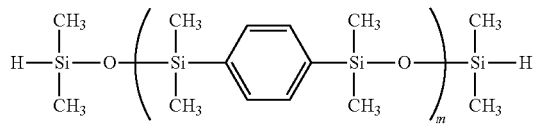

wherein average of m is 30.

Synthesis Example 5

(B-1) Synthesis of Organohydrogen Polysiloxane 3 Having a Silphenylene Skeleton

In a flask, put were 583.26 g (3.0 mols) of 1,4-bis(dimethylsilyl)benzene and 73.31 g (0.3 mol) of diphenyldimethoxy silane, and was cooled. To the mixture, dropwise added was 0.31 g (0.1 mol) of tris(pentafluorophenyl) borane and, then, stirred at 0 degrees C for 5 hours. The resulting mixture was washed with water and subjected to a distillation under reduced pressure to remove the solvent. To the remaining mixture, added was 26.86 g (0.20 mol) of 1,1,3,3-tetramethyldisiloxane, was cooled, subsequently dropwise added was strong sulfuric acid, and stirred at 25 degrees C. over a night. The resulting mixture was washed with water and subjected to a distillation under reduced pressure to remove the solvent to obtain a siloxane resin represented by the following formula, hereinafter referred to as "silphenylene containing-hydrogen siloxane 3". The amount of the hydrogen gas was 3.35 ml/g. The amount of the phenyl group was 4.6%.

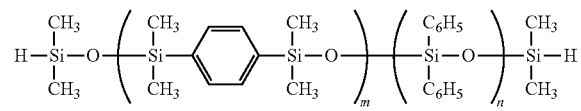

wherein average of m is 30 and average of n is 3.

Synthesis Example 6

Synthesis of Organoalkoxypolysiloxane 1 Having a Silphenylene Skeleton

In a flask, put were 763.41 g (3.0 mols) of 1,4-bis(dimethylmethoxysilyl)benzene and 500 g of water. To the resulting mixture, dropwise added was 211.6 g (1 mol) of phenyltrichlorosilane. The resulting mixture was washed with water and subjected to a distillation under reduced pressure to remove the solvent to obtain a siloxane resin represented by the following formula, hereinafter referred to as "resin 6".

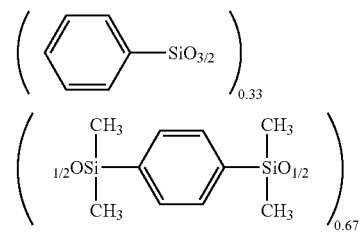

Examples 1 to 8

The siloxane resins prepared in Synthesis Examples 1 to 5 and the following components were mixed in the compositions shown in the following Table 1-1 to prepare silicone resin compositions. The amounts described in Table 1-1 are in part by mass. The amount of the hydrosilylation catalyst described in Table 1-1 is an amount of a solution of chloroplatinic acid in octyl alcohol, containing 2 mass % of the active component.

(A-2) Alkenyl group-containing linear organopolysiloxane 1, VFf1, represented by the following formula and having a viscosity of 4,000 mPa·s at 25 degrees C. The amount of the phenyl group is 29.1%.

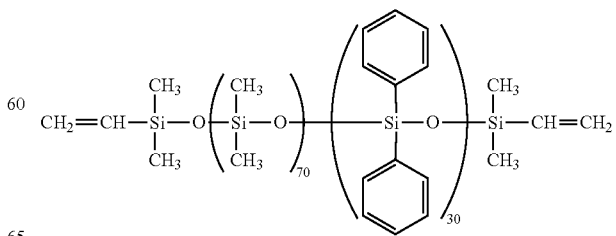

(A-2) Alkenyl group-containing linear organopolysiloxane 2, VFf2, represented by the following formula and having a viscosity of 680 mPa·s at 25 degrees C. The amount of the phenyl group is 24.0%.

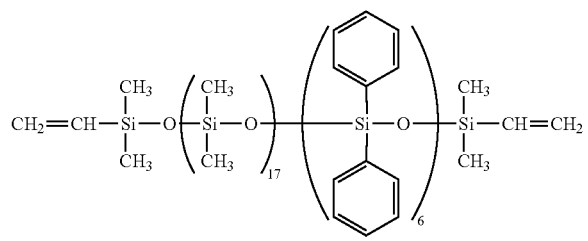

(B-2) Organohydrogenpolysiloxane 1 having phenyl groups of 14.2%.

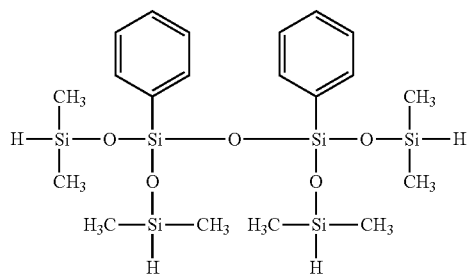 [SMILES: C[SiH](C)O[Si](O[SiH](C)C)(O[Si](O[SiH](C)C)(O[SiH](C)C)c1ccccc1)c1ccccc1]

(B-2) Organohydrogenpolysiloxane 2 having phenyl groups of 40%.

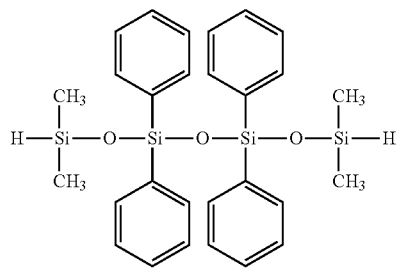 [SMILES: C[SiH](C)O[Si](O[Si](O[SiH](C)C)(c1ccccc1)c1ccccc1)(c1ccccc1)c1ccccc1]

(C) Hydrosilylation catalyst: Solution of chloroplatinic acid in octyl alcohol, containing 2 mass % of platinum
(D) Adhesion-imparting agent:

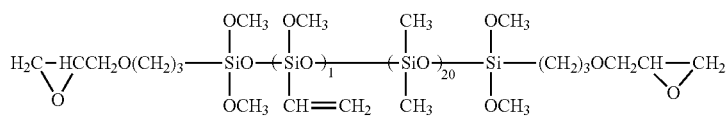

(E) Antioxidant: Irganox 1010, ex BASF Japan Ltd.

Comparative Examples 1 to 4

In Comparative Examples 1 and 2, siloxane had no monovalent aromatic hydrocarbon group. The siloxanes were represented by the following formulas (1) to (3). In Comparative Examples 3 and 4, compositions did not contain component (B-1). The compounds were mixed in the compositions shown in the following Table 2-1 to prepare the silicone resin compositions. The amounts described in Table 2-1 are in part by mass.

Siloxane (1): Vinyl methyl siloxanes (VMQ) having a resin structure, i.e. three-dimensional crosslinked structure, which consists of 50 mole % of $SiO_2$ unit, 42.5 mole % of $(CH_3)_3SiO_{0.5}$ unit and 7.5 mole % of $Vi_3SiO_{0.5}$ unit Siloxane (2): Polysiloxane (VF) represented by the following formula:

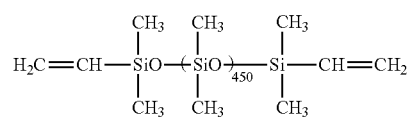

Siloxane (3): Hydrogen polysiloxanes (HDM) represented by the following formula:

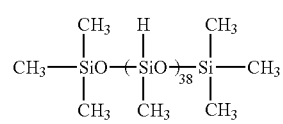

Comparative Example 51

In Comparative Example 5, a condensation-curing type of silicone resin composition was prepared.

100 Parts by mass of the siloxanes resin prepared in the aforesaid Synthesis Example 6 and 0.1 part by mass of titanium diisopropoxy bis(ethylacetoacetate), containing 11.2 mass % of titanium, Orgatix TC-750 ex Matsumoto Fine Chemical Co. Ltd., were mixed to obtain a colorless and transparent composition.

Preparation of Cured Products and Evaluations

The silicone resin compositions prepared in Examples 1 to 8 and Comparative Examples 1 to 5 were subjected to curing in a mold under heating at 150 degrees C. for 4 hours to obtain cured products with a length of 110 mm, a width of 120 mm, and a thickness of 2 mm. Evaluations of the cured products were conducted according to the following manners. The results are as shown in Tables 1-2 and 2-2.

The reaction rate of the composition of Comparative Example 5 was slow and did not completely cure and, therefore, the composition was not evaluated.

(1) Appearance of the Cured Products

The cured product was observed by the naked eyes to evaluate its color and transparency.

(2) Rubber Properties of the Cured Products

The tensile strength, hardness and elongation at break of the cured products were determined according to JIS K 6301. The hardness was determined with a type A spring test instrument.

(3) Abbe's Number of the Cured Products

A refractive index of the cured products was measured by Prism Coupler, ex Metricon Co. Ltd, according to JIS K 7142. The Abbe's number, $v_D$, was calculated by the following equation:

$$v_D=(n_D-1)/(n_F-n_C)$$

wherein $n_D$ is the refractive index at the wavelength of the Fraunhofer D special line: 589.6 nm, $n_F$ is the refractive index at the wavelength of the Fraunhofer F special line: 486.1 nm, and $n_C$ is the refractive index at the wavelength of the Fraunhofer C special line: 656.3 nm.

(4) Water Vapor Permeability of the Cured Products

Water vapor permeability was determined in humidity detection sensor method, i.e. Lyssy testing method, according to JIS K 7129:2008, with L80-5000, ex Systech Instruments Ltd.

Further, a semiconductor element was encapsulated with the cured product of the silicone resin composition prepared in the Examples and the Comparative Examples to prepare optical semiconductor devices, i.e. LED devices, in the manners as described below. The optical semiconductor devices were evaluated in the following manners. The results are as shown in Tables 1-2 and 2-2.

Preparation of LED Devices

A cup-shape pre-molded package for an LED was provided which had dimensions of 3 mm×3 mm×1 mm and an opening having a diameter of 2.6 mm and was equipped, on the bottom surface, with a copper lead frame plated with silver of a thickness of 2 μm. The package was treated with argon plasma at 100 W for 10 seconds of the exposure time. An electrode of an InGaN type blue light-emitting device was connected to the lead frame present on the bottom surface with a silver past, namely, conductive adhesive. A counter electrode of the light emitting device was connected to a counter lead frame with a gold wire. Then, each of the silicone resin compositions was fed through the opening of each of the packages, and cured at 60 degrees C for one hour and subsequently at 150 degrees C. for 4 hours to prepare LED devices.

Evaluations of the LED Devices (1) Sulfuration Test

While an electrical current of 25 mA was applied to the aforesaid LED devices to light on, the devices were left in a hydrogen sulfide gas atmosphere at 150 degrees C. for 1000 hours. Then, discoloration on the silver plated surface of the packages was observed with the naked eyes.

(2) Heat Cycle Test

The LED devices were subjected to 200 heat cycles of –40 degrees C. for 10 minutes and 100 degrees C. for 10 minutes. The number of the test pieces which showed peeling or cracks at the interface of the package was counted and discoloration on the silver plated surface in the package was observed with the naked eyes.

(3) Lighting Test at a High Temperature and High Humidity

The LED devices were subjected to an LED lighting test at 60 degrees C. and 90RH % for 500 hours, and the number of the test pieces which showed peeling or cracks at the interface of the package was counted and discoloration on the silver plated surface in the package was observed with the naked eyes.

(4) Brightness

The brightness of the LED devices was determined, relative to 100 of a relative luminous flux of the LED device with the composition prepared in Example 1. The relative luminous flux was determined with the following measuring instrument and conditions.

Measuring instrument: PHOTONIC MULTI-CHANNEL ANALYZER C10027, ex Hamamatsu Photonics K.K.

Applied current: 10 mA
Number of the samples: 5
Measurement unit: lm/w

TABLE 1-1

|   | Component | Ex. 1 | Ex. 2 | Ex. 3 | Ex. 4 | Ex. 5 | Ex. 6 | Ex. 7 | Ex. 8 |
|---|---|---|---|---|---|---|---|---|---|
| A 1 | Organopolysiloxane resin 1 | 63 | 63 | 63 |  |  | 63 | 63 | 63 |
|  | Organopolysiloxane resin 2 |  |  |  | 68.5 | 68.5 |  |  |  |
| A-2 | Linear organopolysiloxane 1 | 11.1 | 11.1 | 11.1 | 12.1 | 12.1 | 11.1 |  | 5 |
|  | Linear organopolysiloxane 2 |  |  |  |  |  |  | 11.1 |  |
|  | Silphenylene-containing hydrogensiloxane 1 |  | 30.3 | 30.3 | 10.1 | 10.1 |  | 30.3 | 120.6 |
| B-1 | Silphenylene-containing hydrogensiloxane 2 |  |  |  |  |  | 150.2 |  |  |
|  | Silphenylene-containing hydrogensiloxane 3 | 158.3 |  |  |  |  |  |  |  |
| B-2 | Organohydrogen polysiloxane 1 | 8 | 8 | 8 | 6 | 6 | 12 | 8 |  |
|  | Organohydrogen polysiloxane 2 | 11.9 | 11.8 | 11.8 | 12.1 | 12.1 | 15 | 11.9 |  |
|  | SiH/Si-Vi, molar ratio | 1.1 | 1.1 | 1.1 | 1.1 | 1.1 | 1.1 | 1.1 |  |
| C | Hydrosilylation catalyst | 0.02 | 0.02 | 0.02 | 0.02 | 0.02 | 0.02 | 0.02 | 0.02 |
| D | Adhesion-imparting agent | 2 | 2 | 2 | 2 | 2 | 2 | 2 | 2 |
| E | Antioxidant |  |  |  |  | 0.1 |  |  |  |

TABLE 1-2

|  |  | Ex. 1 | Ex. 2 | Ex. 3 | Ex. 4 | Ex. 5 | Ex. 6 | Ex. 7 | Ex. 8 |
|---|---|---|---|---|---|---|---|---|---|
| Evaluation | Appearance | Colorless and transparent | Colorless and transparent | Colorless and transparent | Colorless and transparent | Colorless and transparent | Colorless and transparent | Colorless and transparent | Colorless and transparent |
|  | Hardness, TypeA | 55 | 88 | 89 | — | — | 32 | 86 | 35 |
|  | Hardness, TypeD | — | 40 | 41 | 55 | 53 | — | 32 | — |
|  | Tensile strength, MPa | 4.2 | 7.3 | 7.4 | 1.8 | 1.9 | 3.1 | 2.8 | 1.5 |
|  | Elongation at break, % | 105 | 50 | 55 | 25 | 30 | 80 | 20 | 180 |

TABLE 1-2-continued

|  | Ex. 1 | Ex. 2 | Ex. 3 | Ex. 4 | Ex. 5 | Ex. 6 | Ex. 7 | Ex. 8 |
|---|---|---|---|---|---|---|---|---|
| Abbe's number, $v_d$ | 62 | 69 | 68 | 65 | 63 | 60 | 57 | 60 |
| Sulfuration test | Colorless and transparent | Colorless and transparent | Colorless and transparent | Colorless and transparent | Colorless and transparent | Colorless and transparent | Colorless and transparent | Colorless and transparent |
| Heat cycle test | 0/5 Colorless and transparent | 0/5 Colorless and transparent | 0/5 Colorless and transparent | 0/5 Colorless and transparent | 0/5 Colorless and transparent | 0/5 Colorless and transparent | 0/5 Colorless and transparent | 0/5 Colorless and transparent |
| Lighting test at a high temperature and high humidity | 0/5 Colorless and transparent | 0/5 Colorless and transparent | 0/5 Colorless and transparent | 0/5 Colorless and transparent | 0/5 Colorless and transparent | 0/5 Colorless and transparent | 0/5 Colorless and transparent | 0/5 Colorless and transparent |
| Water vapor permeability, $g/m^3 \cdot day$ | 8 | 7 | 7 | 5 | 6 | 10 | 8 | 10 |
| Brightness, relative luminous flux | 100 | 100 | 99 | 98 | 100 | 98 | 97 | 97 |

TABLE 2-1

|  | Component | Com. Ex. 1 | Com. Ex. 2 | Com. Ex. 3 | Com. Ex. 4 |
|---|---|---|---|---|---|
| A-1 | Organopolysiloxane resin 1 |  |  | 60.8 |  |
|  | Organopolysiloxane resin 2 |  |  |  | 65.6 |
|  | VMQ | 25 | 50 |  |  |
| A-2 | Linear organopolysiloxane 1 |  |  | 10.7 | 12.2 |
|  | Linear organopolysiloxane 2 |  |  |  |  |
|  | VF | 75 | 50 |  |  |
| B-1 | Silphenylene-containing hydrogensiloxane |  |  |  | — |
| B-2 | Organohydrogen polysiloxane 1 |  |  | 5.7 | 4.4 |
|  | Organohydrogen polysiloxane 2 |  |  | 22.8 | 17.7 |
|  | HDM | 1.5 | 1.5 |  |  |
|  | SiH/Si-Vi, molar ratio | 1.1 | 1.1 | 1.1 | 1.1 |
| C | Hydrosilylation catalyst | 0.02 | 0.02 | 0.02 | 0.02 |
| D | Adhesion-imparting agent | 2 | 2 | 2 | 2 |

TABLE 2-2

|  |  | Com. Ex. 1 | Com. Ex. 2 | Com. Ex. 3 | Com. Ex. 4 |
|---|---|---|---|---|---|
| Evaluation | Appearance | Colorless and transparent | Colorless and transparent | Colorless and transparent | Colorless and transparent |
|  | Hardness, TypeA | 40 | 85 | 78 | 85 |
|  | Hardness, TypeD | — | 41 | — | 41 |
|  | Tensile strength, MPa | 5 | 2 | 5 | 2 |
|  | Elongation at break, % | 120 | 30 | 65 | 30 |
|  | Abbe's number, $v_D$ | 42 | 4.6 | 37 | 35 |
|  | Sulfuration test | Yellowing | Slight yellowing | Slightly yellowing | Colorless and transparent |
|  | Heat cycle test | 1/5 Peeling occurred Colorless and transparent | 5/5 Peeling occurred Colorless and transparent | 1/5 Peeling occurred Colorless and transparent | 2/5 Cracks occurred Colorless and transparent |
|  | Lighting test at a high temperature and high humidity | 2/5 Peeling occurred Yellowing | 1/5 Cracks occurred Yellowing | 1/5 Peeling occurred Slightly yellowing | 1/5 Cracks occurred Slightly yellowing |
|  | Water vapor permeability, $g/m^3 \cdot day$ | 75 | 55 | 15 | 12 |
|  | Brightness, relative luminous flux | 77 | 71 | 80 | 82 |

As seen in Table 1, the cured products obtained from the silicone compound of the present invention had the larger Abbe's number, no discoloration due to sulfuration test on the silver plated surface of the package, and caused no peeling and no cracks in the severe heat cycle test. Further, the brightness of the LED devices provided with the cured product was increased, compared to the LED devices provided with the cured product obtained from the conventional silicone resin composition.

INDUSTRIAL APPLICABILITY

The present silicone resin composition provides a cured product having a larger Abbe's number and an optical semiconductor device having good resistance to discoloration. Therefore, the present silicone resin composition is useful as a material for encapsulating optical semiconductor elements.

The invention claimed is:

1. A silicone resin composition comprising
   (A-1) an organopolysiloxane having a three-dimensional crosslinked structure, at least two alkenyl groups, and at least one monovalent aromatic hydrocarbon group bonded to a silicon atom,
   (A-2) a linear organopolysiloxane having alkenyl groups at at least both terminals of a molecular chain and at least one monovalent aromatic hydrocarbon group bonded to a silicon atom,
   (B-1) a linear organohydrogen polysiloxane having at least one silphenylene skeleton in a molecular chain and hydrosilyl groups at at least both terminals of the molecular chain, in an amount such that a ratio of the number of the hydrosilyl groups in component (B-1) to a total number of the alkenyl groups in components (A-1) and (A-2) is 0.5 to 2, and (C) a hydrosilylation catalyst in a catalytic amount.

2. The silicone resin composition according to claim 1, wherein component (B-1) is represented by the following general formula (1):

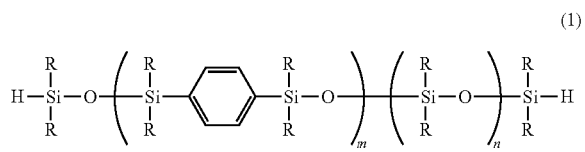

wherein R is, independently of each other, selected from the group consisting of substituted or unsubstituted monovalent aliphatic hydrocarbon groups which have 1 to 10 carbon atoms and may have an unsaturated bond, and monovalent aromatic hydrocarbon groups having 6 to 12 carbon atoms, m is an integer of from 1 to 1,000, n is an integer of from 0 to 300, and the parenthesized repeating units may bond randomly each other or form a block unit.

3. The silicone resin composition according to claim 1, wherein the number of the monovalent aromatic hydrocarbon group bonded to a silicone atom in the linear oragnopolysiloxane (A-2) is 5 to 45%, relative to a total number of the substituents each bonded to a silicon atom.

4. The silicone resin composition according to claim 1, wherein the organopolysiloxane (A-1) is represented by the following average compositional formula (2):

$$R1aR2bR3cSiO(4-a-b-c)/2 \quad (2)$$

wherein R1 is, independently of each other, a substituted or unsubstituted monovalent aliphatic hydrocarbon group which has 1 to 10 carbon atoms, R2 is, independently of each other, a monovalent aromatic hydrocarbon group having 6 to 12 carbon atoms, R3 is, independently of each other, an alkenyl group having 2 to 8 carbon atoms, a is the number of 0.4 to 1, b is the number of 0.1 to 0.5, and c is the number of 0.05 to 0.5, provided that a total of a, b and c is 0.5 to 2.

5. The silicone resin composition according to claim 1, wherein the composition further comprises (B-2) an organohydrogenpolysiloxane having at least two hydrosilyl groups and no silphenylene skeleton, in an amount such that a ratio of a total number of the hydrosilyl groups in components (B-1) and (B-2) to a total number of the alkenyl groups in components (A-1) and (A-2) is 0.5 to 2.

6. The silicone resin composition according to claim 5, wherein the organohydrogenpolysiloxane (B-2) is represented by the following general formula (3):

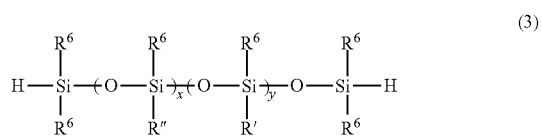

wherein R6 is, independently of each other, selected from the group consisting of substituted or unsubstituted monovalent aliphatic hydrocarbon groups which have 1 to 10 carbon atoms and may have an unsaturated bond, and monovalent aromatic hydrocarbon groups having 6 to 12 carbon atoms, R' is, independently of each other, selected from the aforementioned groups defined for R6 or a group represented by the following (4):

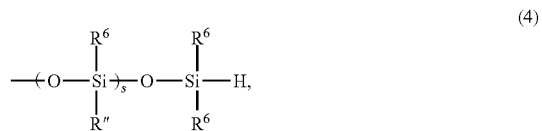

wherein R" is, independently of each other, a hydrogen atom or is selected from the aforementioned groups defined for R6, the parenthesized repeating units may bond randomly each other or form a block unit, x is an integer of from 0 to 1,000, y is an integer of from 0 to 1,000, and s is an integer of from 0 to 1,000, provided that a total of x, y and s is 1 to 1,000.

7. The silicone resin composition according to claim 1, wherein the composition further comprises an adhesion-imparting agent (D).

8. The silicone resin composition according to claim 1, wherein the composition further comprises an antioxidant (E).

9. The silicone resin composition according to claim 8, wherein the antioxidant (E) is a hindered phenol antioxidant.

10. An optical semiconductor device provided with a cured product obtained by curing the silicone resin composition according to claim 1.

* * * * *